(12) United States Patent
Grňo

(10) Patent No.: US 9,989,562 B2
(45) Date of Patent: Jun. 5, 2018

(54) SENSOR AND METHOD FOR ELECTRIC CURRENT MEASUREMENT

(71) Applicant: Ladislav Grňo, Bratislava (SK)

(72) Inventor: Ladislav Grňo, Bratislava (SK)

( * ) Notice: Subject to any disclaimer, the term of this patent is extended or adjusted under 35 U.S.C. 154(b) by 0 days. days.

(21) Appl. No.: 15/120,202

(22) PCT Filed: Apr. 15, 2014

(86) PCT No.: PCT/SK2014/050013
§ 371 (c)(1),
(2) Date: Aug. 19, 2016

(87) PCT Pub. No.: WO2015/122855
PCT Pub. Date: Aug. 20, 2015

(65) Prior Publication Data
US 2017/0074907 A1  Mar. 16, 2017

(30) Foreign Application Priority Data
Feb. 11, 2014 (SK) .................. 50013-2014

(51) Int. Cl.
*G01R 27/28* (2006.01)
*G01R 15/18* (2006.01)
*H01F 38/40* (2006.01)

(52) U.S. Cl.
CPC ........... *G01R 15/185* (2013.01); *H01F 38/40* (2013.01)

(58) Field of Classification Search
USPC ....................................................... 324/654
See application file for complete search history.

(56) References Cited

U.S. PATENT DOCUMENTS 3,153,758 A   10/1964  Kusters et al.
3,665,356 A *  5/1972  Douglas .................. H01F 27/36
                                                        336/175
(Continued)

FOREIGN PATENT DOCUMENTS

DE   10 2012 009 243 B3   9/2013
EP         1 494 033 A1   1/2005
(Continued)

OTHER PUBLICATIONS

Rudolf Severns, "Improving and Simplifying HF Direct Current Sensors," Proceedings of the 1986 IEEE Applied Power Electronics Conference (APEC 86), pp. 180-183.
(Continued)

*Primary Examiner* — Patrick Assouad
*Assistant Examiner* — Demetrius Pretlow
(74) *Attorney, Agent, or Firm* — Ostrolenk Faber LLP

(57) ABSTRACT

A sensor of electric current including a fiber (1) from a soft magnetic material with a uniform cross-sectional area and uniform magnetic properties along its whole length, equipped with an excitation coil (2) wound on said fiber (1) with a uniform winding density along the substantially whole length and possibly equipped with a sensing coil (3) wound on said fiber (1) with uniform winding density along the substantially whole length, where said fiber (1) ends are mechanically joined to form a loop enclosing the measured current carrying conductor (4) by said fiber (1), wherein said excitation coil (2) is connected to the current output of a current source (5) through a current transducer (6) generating a current signal corresponding to the excitation current flowing through said excitation coil (2) wherein the sensor is equipped with a voltage transducer (7) generating a voltage signal corresponding to the voltage on the possibly present sensing coil (3) or on the excitation coil (2) wherein
(Continued)

said voltage signal and said current signal are fed into a processor unit (8). The present disclosure also relates to a method for electric current measurement using said sensor.

13 Claims, 2 Drawing Sheets

(56) References Cited

U.S. PATENT DOCUMENTS

| | | | |
|---|---|---|---|
| 4,023,100 A | 5/1977 | Smutny | |
| 5,053,695 A | 10/1991 | Canter | |
| 5,552,979 A | 9/1996 | Gu et al. | |
| 5,583,475 A * | 12/1996 | Raholijaona | H01F 17/062 |
| | | | 29/602.1 |
| 5,811,965 A | 9/1998 | Gu | |
| 5,994,899 A | 11/1999 | Mohri | |
| 6,335,600 B1 * | 1/2002 | Kasai | B62D 5/0487 |
| | | | 318/434 |
| 6,437,554 B1 * | 8/2002 | Atwater | G01R 15/181 |
| | | | 324/117 H |
| 7,071,678 B2 | 7/2006 | Karlsson et al. | |
| 2004/0140879 A1 * | 7/2004 | Schafer | H01F 38/28 |
| | | | 336/229 |
| 2008/0106252 A1 * | 5/2008 | Hsu | G01R 15/183 |
| | | | 324/127 |
| 2011/0140694 A1 * | 6/2011 | Cima | G01R 33/04 |
| | | | 324/253 |
| 2012/0194171 A1 * | 8/2012 | Blakely | G01R 15/185 |
| | | | 324/117 R |
| 2013/0057267 A1 * | 3/2013 | Klein | G01R 15/185 |
| | | | 324/234 |
| 2014/0320112 A1 * | 10/2014 | Nodera | G01R 15/183 |
| | | | 324/127 |
| 2015/0276816 A1 * | 10/2015 | Yoshida | G01R 15/185 |
| | | | 324/244 |

FOREIGN PATENT DOCUMENTS

| | | |
|---|---|---|
| JP | H05-10980 A | 1/1993 |
| JP | H11-2646 A | 1/1999 |

OTHER PUBLICATIONS

International Search Report dated Oct. 27, 2014 issued in corresponding International patent application No. PCT/SK2014/050013.

Written Opinion dated Oct. 27, 2014 issued in corresponding International patent application No. PCT/SK2014/050013.

\* cited by examiner

SENSOR AND METHOD FOR ELECTRIC CURRENT MEASUREMENT

CROSS REFERENCE TO RELATED APPLICATIONS

The present application is a 35 U.S.C. § 371 National Phase conversion of PCT/SK2014/050013, filed Apr. 15, 2014, which claims benefit of Slovakia Application No. PP50013-2014, filed Feb. 11, 2014, the disclosure of which is incorporated herein by reference. The PCT International Application was published in the English language.

TECHNICAL FIELD

The invention is related to sensor circuit and method for electric current measurement. More particularly, the invention is directed to novel flexible open-able sensor construction, electronic evaluation circuit and method of measurement of electric current including DC content.

BACKGROUND OF THE INVENTION

The electric current sensors capable to measure the DC content are basic components for control and monitoring used in DC industrial applications for example motor management, power supplies, welding supplies, electrolysis, galvanic metallization etc. The amplitudes of the current in such eventually other low-power applications can occur in the range from fraction of milliampere to hundreds of kiloamperes.

The sensors for small currents are mainly based on resistive shunt inserted into current path and the voltage drop on the shunt is the measure of the current flowing through this path. Disadvantage of this approach is the discontinuity in the current path and additional power loss in the shunt. Therefore this method is limited to fractions of kiloamperes. Disadvantage of the shunt method is the need of the current circuit disconnection for shunt installation.

Other method of the current measurement is based on utilization of the magnetic field created by the electric current as a measure of the current. The magnetic field of the current carrying conductor is concentrated via magnetic circuit made of soft magnetic material into gap containing a magnetic field sensor. The sensor can exploit various principles like Hall Effect, magnetoresistance, nonlinearity of magnetization characteristic of soft magnetic materials, high frequency impedance dependence on the magnetic field etc. As the magnetic field sensors are generally not linear in order to obtain higher accuracy the sensor must be equipped with additional electronic feedback control. This control system needs for higher measured currents high power. This known compensating method is based on measurement of the flux level in the transformer core and compensation of the flux originating from the primary current with a secondary current in the secondary winding and this way keeping the total flux level in the gap zero. In this case the compensating secondary current is scaled measure for the primary current. Disadvantage of this known technique is that it is sensitive to secondary current waveform distortion due to saturation of the transformer core. Disadvantage of the Hall sensor used as zero level sensor is its not negligible and unstable offset.

A similar method is described in U.S. Pat. No. 5,552,979. According to this known method the flux level in the transformer core is calculated from the voltage over the secondary winding, and is constantly controlled to be kept within positive and negative saturation.

U.S. Pat. No. 5,053,695 describes a circuit which periodically resets the flux level in the current transformer core from saturated to unsaturated state.

A similar method of controlling a current transformer is described in R. Severns, "Improving and simplifying HF direct current sensors", Proceedings of the 1986 IEEE Applied Power Electronics Conference (APEC 86), pp. 180 183. This paper describes a method periodically driving a current transformer core in and out of saturation. This suggested technique improves the ability to measure current in any arbitrary direction, and a way of making the current transformer core go in to and out of saturation fast, for high and physically asymmetric magnetic fields induced by primary current in the primary winding, thereby greatly reducing the losses and increasing the ability to measure high currents.

Another method is described in U.S. Pat. No. 5,811,965. This method involves a constant application of an alternating voltage to the secondary winding of a current transformer. This guarantees that the transformer core is in the linear mode when the measurements are conducted.

U.S. Pat. No. 7,071,678 presents a method of controlling the flux density in a current transformer to keep the transformer core saturated between two consecutive measurements in a sampling measurement system. Saturation disables transformation of primary to secondary current, and thereby disables losses in the secondary circuit during this time. Both AC and direct currents are possible to measure. The use of saturation of the transformer core also permits the core to be designed physically small. In order to get effective and accurate low power consuming measurements, both the magnetic fields originating from primary current flowing in the primary winding and external magnetic fields must be symmetrically physically spread in the transformer core. This greatly limits the possible physical arrangement of the primary winding. The invention describes a method dividing the secondary winding into two or more separate winding sections.

Generally, all methods based on concentration of the magnetic field into place of a local magnetic field sensor via passive magnetic core suffer from non-linearity and finite permeability of the real core material and thus not negligible magnetic resistance leading to increase of the mass of the core with extreme cost and space consuming solutions and remarkable power consumption. The passive magnetic cores lead to remarkable measurement error at non-homogeneous magnetic field.

The use of an amorphous wire as a magneto-impedance element has been proposed in U.S. Pat. No. 5,994,899. A magneto-impedance element includes an amorphous wire having a spiral magnetic anisotropy. A dc-biased alternating current is supplied to the amorphous wire, whereby a voltage is produced between both ends of the amorphous wire. The amplitude of the voltage depends on externally applied magnetic field. This method is generally not linear and has strongly limited amplitude range.

Disadvantage of magneto-impedance based sensors generally is in dependence on stray field, temperature, part variation and the like and therefore the accuracy is strongly limited.

To state of the art belong also the transducers based on fiber-optic sensing elements that use the magnetic and electric fields surrounding the conductor to modulate the condition of light in optical crystals. The advantages of these systems are the intrinsic safety associated with fiber-optic and rejection of ambient electromagnetic interference. The disadvantages of the fiber-optic sensors are the effects of pressure and temperature gradients, mechanical vibrations, and other environmental noises that can alter the birefringence along the fiber, resulting to scale factor variation. Main disadvantage of the fiber-optic devices is their high cost.

From the present state of the art arises a need for a sensor capable to measure the electric current including its DC component with negligible influence of magnetic field distribution in the measurement area to measurement accuracy in high current amplitude range, without need for current circuit disconnection and negligible space requirement.

SUMMARY OF THE INVENTION

The goal of the present invention is proposal of a sensor for current measurement capable to measure the DC component of the current with high accuracy even at non-homogeneous magnetic field, low power consumption, simple integration into existing equipments without need for current path break and with low realization cost.

This problem is solved by the present invention, which resides in that the current sensor comprises a fiber from soft magnetic material with uniform cross-sectional area and uniform magnetic properties along the whole length. The fiber is equipped with an excitation coil wound on the fiber with uniform winding density along the substantially whole length of the fiber. The fiber can be further equipped with sensing coil wound on the fiber with uniform winding density along the whole length of the fiber. The order of the excitation coil and the sensing coil is nonessential. The fiber is formed into loop enclosing the measured current carrying conductor. The loop is closed via mechanical join of the fiber ends. The excitation coil is connected to output of a current source through a current transducer. The current transducer generates a current signal corresponding to the excitation current flowing through the excitation coil. The sensor is further equipped with a voltage transducer generating a voltage signal tracking the voltage either on the sensing coil if present or on the excitation coil. The current signal and the voltage signal are led into processor unit.

The current source is prepared to generate a current with value oscillating between two current limits. The value limits can be fixed prior to measurement procedure or can be set dynamically during the measurement procedure in dependence on the state of magnetization of the fiber. Oscillation is maintained so that at reaching any of two current limits the current slope is set toward to the other current limit.

The current limits are set so that the exiting current value reaching the first current limit excitation is capable to excite, including the external magnetic field, the whole volume of magnetic material of the fiber into the saturation state. The second current limit has the value at which the excitation current is capable to excite, including the external magnetic field, the whole volume of magnetic material of the fiber into the opposite oriented saturation state.

The area of the mechanical junction of the fiber ends is advantageously equipped with soft magnetic material preferable in form of a cylinder around the junction.

The excitation coil can preferable consist of interconnected pairs of windings with the members of each pair wound in mutually opposite directions.

The sensing coil can preferable consist of interconnected pairs of windings with the members of each pair wound in mutually opposite directions.

The fiber equipped with excitation coil and possibly with the sensing coil can be preferably inserted into a tube from electrically conductive material enclosing the fiber along its substantially whole length. This arrangement eliminates the influence of the external electric field influence on the sensor an further acts as a low-pass filter eliminating influence of the high frequency content of measured current and external magnetic field on the evaluation electronics of the sensor.

It is advantageous when the voltage transducer is equipped with low-pass filter damping the high frequency content of the processed voltage.

It is advantageous when the current transducer is equipped with low-pass filter damping the high frequency content of the processed current.

It is also a part of the present solution a method of electric current measurement with sensor according to invention where the value of the measured current is calculated from the definite integral of the time function of the product of the excitation current and the voltage induced by magnetic field into sensing coil or excitation coil:

$$\int_{T_1}^{T_2} I_i(t) U_i(t) dt$$

Meaning of Used Symbols:
$U_i(t)$—is the time function of the induced voltage
$I_i(t)$—is the time function of the excitation current
$T_1$—is the start time of the integration
$T_2$—is the end time of the integration The start time of the integration is the time in which the excitation current value has the value of one current limit at which the whole volume of the fiber material is in saturated state and is directed to the other current limit. The end time of the integration is the time in which said excitation current reaches the value of the other current limit at which the whole volume of the fiber material is in the opposite oriented magnetically saturated state.

Alternative, more precise method of electric current measurement for the sensor of electric current uses calculation of the value of the current from the ratio of the definite integral of the time function of the product of the excitation current and the voltage induced by magnetic field into the sensing coil if present or the excitation coil and the definite integral of the time function of the voltage induced by magnetic field into the sensing coil or the excitation coil. Both integrals are integrated in the same time interval:

$$\frac{\int_{T_1}^{T_2} I_i(t) U_i(t) dt}{\int_{T_1}^{T_2} U_i(t) dt}$$

It is advantageous if the value of the current is calculated as the mean value of currents calculated by one of previous methods at mutually opposite signs of the slope of the time function of the excitation current.

DESCRIPTION OF PREFERRED EMBODIMENT

Figure 1:
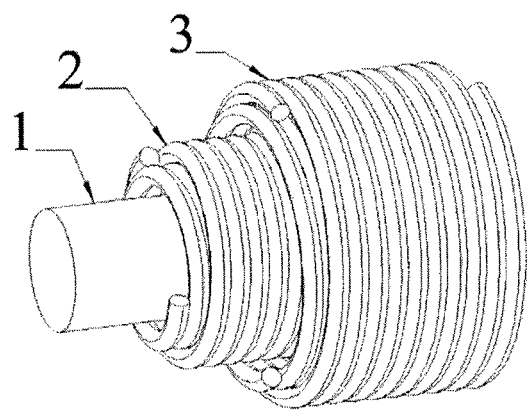
FIG. 1 shows the principal arrangement of the fiber from soft magnetic material equipped with one excitation coil and one sensing coil.

The principal arrangement of the current sensor containing a fiber 1 from soft magnetic material, equipped with one excitation coil 2 and one sensing coil 3 is shown in FIG. 1. The excitation coil 2 and the sensing coil 3 are preferably wound as pair windings with members of the pair wound in mutually opposite direction. This arrangement enables interconnection of the winding pairs on one end of the coil and access to the whole coil winding on the opposite end.

Figure 2:
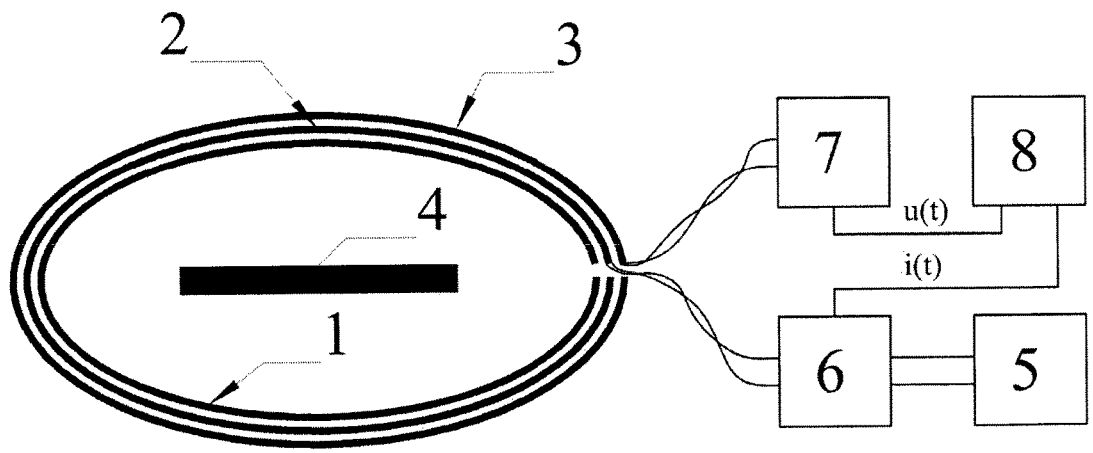
FIG. 2 shows the principal electrical connection of the sensor of electric current according to invention containing the fiber from soft magnetic material equipped with one excitation coil and one sensing coil.

The principal electrical connection for the current sensor containing a fiber 1 from soft magnetic material, equipped with one excitation coil 2 and one sensing coil 3 is shown in FIG. 2. The fiber 1 ends are mechanically joined and this way the fiber 1 creates a closed loop enclosing the measured current caring conductor 4. The current source 5 generates an excitation current into the excitation coil 2. The excitation current is passed through the current transducer 6 producing the current signal i(t) corresponding to the excitation current. The sensing coil 3 is connected to the voltage transducer 7. The voltage transducer 7 produces the voltage signal u(t) corresponding to the induced voltage induced into the sensing coil 3 by the magnetic field. The current signal i(t) and the voltage signal u(t) are led into the processor unit 8.

Figure 3:
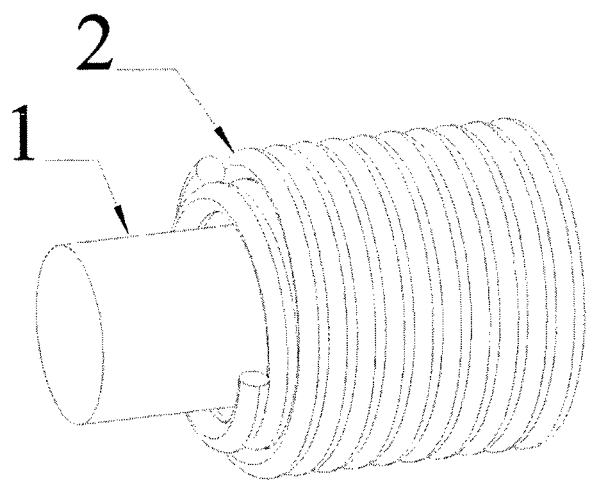
FIG. 3 shows the principal arrangement of the fiber from soft magnetic material equipped with only one excitation coil.

The principal sensor arrangement of the current sensor containing the fiber 1 from soft magnetic material, equipped with one excitation coil 2 is shown in FIG. 3. The excitation coil 2 is wound as pair winding with members of the pair wound in mutually opposite direction. This arrangement enables interconnection of the winding pair on one end of the coil and access to the whole excitation coil 2 on the opposite end.

Figure 4:
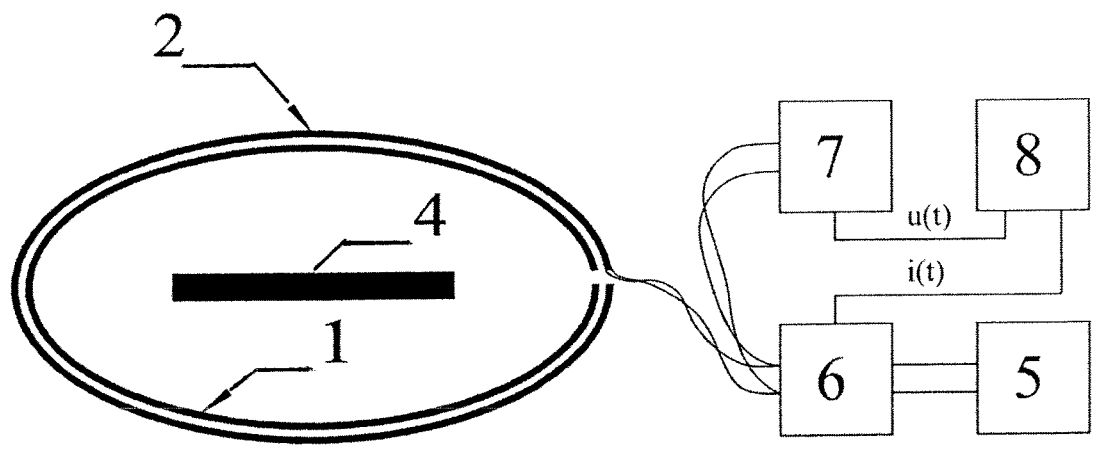
FIG. 4 shows the principal electrical connection of the sensor of electric current according to invention containing the fiber from soft magnetic material equipped with only one excitation coil.

The principal electrical connection for the current sensor containing the fiber 1 from soft magnetic material, equipped with one excitation coil 2 is shown in FIG. 4. The fiber ends are mechanically joined and by this way the fiber 1 creates a closed loop enclosing the measured current caring conductor 4. The current source 5 generates the excitation current into the excitation coil 2. The excitation current is passed through the current transducer 6 which produces the current signal i(t) corresponding to the excitation current. The excitation coil is simultaneously connected to the voltage transducer 7. The voltage transducer 7 produces the voltage signal u(t) corresponding to the summary voltage generated on the sensing coil 2 by the magnetic field and the excitation current. The current signal i(t) and the voltage signal u(t) are led into the processor unit 8.

Figure 5:
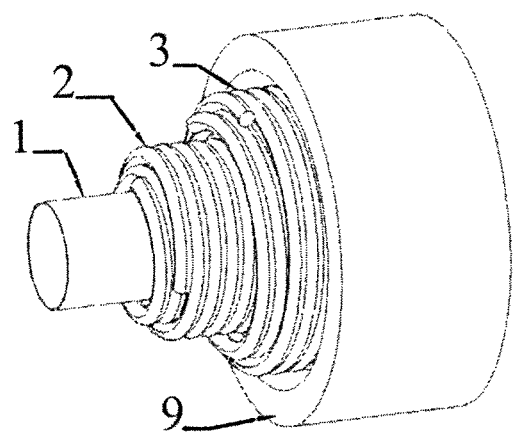
FIG. 5 shows the principal sensor arrangement of the sensor of electric current according to invention containing the fiber from soft magnetic material equipped with one excitation coil and one sensing coil located in a tube from electrically conductive material.

Principal sensor arrangement of the current sensor containing the fiber 1 from soft magnetic material, equipped with one excitation coil 2 and one sensing coil 3 inserted into the tube 9 from electrically conductive material is shown in the FIG. 5.

Figure 6:
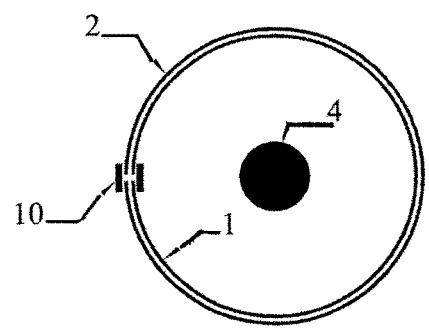
FIG. 6 shows the principal arrangement of the sensor of electric current containing the fiber from soft magnetic material equipped with one excitation coil and the soft magnetic material in form of a cylinder located around the junction of the fiber ends.

FIG. 6 depictures a principal arrangement of the current sensor containing the fiber 1 from soft magnetic material, equipped with one excitation coil 2. The joined ends of the fiber 1 create a closed loop around the current carrying conductor 4. The joined ends are equipped with cylinder 10 from soft magnetic material located around the junction area.

INDUSTRIAL APPLICABILITY

The solution according to the present invention is to be used in control and monitoring systems in various industrial applications requiring high-precision measurement of electric current including its DC content.

The invention claimed is:

1. An electric current sensor comprising:
    a fiber from a soft magnetic material with a uniform cross-sectional area and uniform magnetic properties along its whole length;
    an excitation coil wound on said fiber with a uniform winding density along substantially a whole length,
    wherein said fiber ends are mechanically joined to form a loop enclosing a measured current-carrying conductor by said fiber,
    wherein said excitation coil is connected to the current output of a current source through a current transducer generating a current signal corresponding to the excitation current flowing through said excitation coil,
    wherein the sensor is equipped with a voltage transducer generating a voltage signal corresponding to the voltage on the excitation coil,
    wherein said voltage signal and said current signal are fed into a processor unit.

2. A sensor according to claim 1, wherein said current source is adapted to generate a current the value of which oscillates between two current limits that are either predefined or being set dynamically in dependence on the state of magnetization of said fiber.

3. A sensor according to claim 1, wherein said excitation current when reaching one said current limit is able to excite the whole volume of the magnetic material of said fiber, including said external magnetic field, into the saturated state and when reaching the second said current limit said excitation current is able to excite the whole volume of magnetic material of said fiber, including said external magnetic field, into the opposite oriented saturation state.

4. A sensor according to claim 1, wherein a soft magnetic material is located around the area of joined ends of said fiber.

5. A sensor according to claim 1, wherein said excitation coil comprises at least one pair of windings wherein the members of each pair are wound in mutually opposite directions.

6. A sensor according to claim 1, wherein said sensing coil comprises at least one pair of windings,
    wherein the members of each pair are wound in mutually opposite directions.

7. A sensor according to claim 1, wherein said fiber with said excitation coil is inserted into a tube from an electrically conductive material along substantially the whole length of said fiber.

8. A method for electric current measurement for said sensor according to claim 1, wherein the measured electric current is calculated by said processor unit from the definite integral of the time function of the product of momentary values of said excitation current and said voltage induced by the magnetic field into the excitation coil, wherein the definite integral is calculated in the time interval from the time in which said excitation current has the value of one said current limit at which the whole volume of said fiber material is in the saturated state and is directed to the other current limit to the time in which said excitation current reaches the other said current limit at which the whole volume of said fiber material is in the opposite oriented saturated magnetic state.

9. A method for electric current measurement for said sensor according to claim 1, wherein the measured electric current is calculated by said processor unit from the ratio of the definite integral of the time function of the product of momentary values of said excitation current and said voltage induced by the magnetic field or into the excitation coil and the definite integral of said voltage induced by the magnetic field into or the excitation coil, wherein both integrals are calculated in the time interval from the time in which said excitation current has the value of one said current limit at which the whole volume of said fiber material is in the saturated state and is directed to the other current limit to the time in which said excitation current reaches the other said current limit at which the whole volume of said fiber material is in the opposite oriented saturated magnetic state.

10. Method for electric current measurement for said sensor according to claim 1, wherein the measured electric current is calculated as the mean value of currents calculated for two current-time functions having opposite signs of their slopes.

11. A sensor according to claim 1, further comprising a sensing coil wound on said fiber with a uniform winding density along the substantially whole length, wherein the voltage transducer generates the voltage signal corresponding to the voltage on the sensing coil.

12. A sensor according to claim 1, wherein the measured electric current is calculated by said processor unit from the definite integral of the time function of the product of momentary values of said excitation current and said voltage induced by the magnetic field into the sensing coil, wherein the definite integral is calculated in the time interval from the time in which said excitation current has the value of one said current limit at which the whole volume of said fiber material is in the saturated state and is directed to the other current limit to the time in which said excitation current reaches the other said current limit at which the whole volume of said fiber material is in the opposite oriented saturated magnetic state.

13. A sensor according to claim 1, wherein the measured electric current is calculated by said processor unit from the ratio of the definite integral of the time function of the product of momentary values of said excitation current and said voltage induced by the magnetic field into the sensing coil and the definite integral of said voltage induced by the magnetic field into the sensing coil, wherein both integrals are calculated in the time interval from the time in which said excitation current has the value of one said current limit at which the whole volume of said fiber material is in the saturated state and is directed to the other current limit to the time in which said excitation current reaches the other said current limit at which the whole volume of said fiber material is in the opposite oriented saturated magnetic state.

\* \* \* \* \*